(12) United States Patent
Zhang et al.

(10) Patent No.: US 11,948,799 B2
(45) Date of Patent: Apr. 2, 2024

(54) MINORITY CARRIER LIFETIME REDUCTION FOR SIC IGBT DEVICES

(71) Applicant: Applied Materials, Inc., Santa Clara, CA (US)

(72) Inventors: Qintao Zhang, Mt Kisco, NY (US); Wei Zou, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 130 days.

(21) Appl. No.: 17/480,500

(22) Filed: Sep. 21, 2021

(65) Prior Publication Data

US 2023/0090954 A1  Mar. 23, 2023

(51) Int. Cl.
| | |
|---|---|
| *H01L 21/265* | (2006.01) |
| *H01L 29/06* | (2006.01) |
| *H01L 29/66* | (2006.01) |
| *H01L 29/16* | (2006.01) |

(52) U.S. Cl.
CPC ........ *H01L 21/265* (2013.01); *H01L 29/0684* (2013.01); *H01L 29/66068* (2013.01); *H01L 29/1608* (2013.01)

(58) Field of Classification Search
CPC ............... H01L 21/265; H01L 29/0684; H01L 29/66068; H01L 29/1608; H01L 29/0834; H01L 29/32; H01L 29/66333–66348; H01L 29/7393–7398; H01L 2924/13055; H01L 29/083–0839; H01L 29/66712–66734; H01L 29/7802–7815

See application file for complete search history.

(56) References Cited

U.S. PATENT DOCUMENTS

| | | | |
|---|---|---|---|
| 2012/0235281 A1* | 9/2012 | Abraham | C23C 14/548 257/E21.334 |
| 2014/0374793 A1* | 12/2014 | Miyazaki | H01L 29/1095 438/530 |
| 2019/0326119 A1* | 10/2019 | Yoshimura | H01L 29/8611 |

OTHER PUBLICATIONS

Ranbir Singh and Siddarth Sundaresan, Towards Medium Voltage (3.3-15kV) SiC Devices, GeneSiC Semiconductor Inc., 29 pages.
Han et al., A Review of SiC IGBT: Models, Fabrications, Characteristics, and Applications, IEEE Transactions on Power Electronics, vol. 36, No. 2, Feb. 2021, 2080-2093, 14 pages.
Hazdra et al., Optimization of SiC Power p-i-n Diode Parameters by Proton Irradiation, IEEE Transactions on Electron Devices, vol. 65, No. 10, Oct. 2018, 4483-4489, 7 pages.

* cited by examiner

*Primary Examiner* — Cuong B Nguyen
(74) *Attorney, Agent, or Firm* — KDW Firm PLLC

(57) ABSTRACT

Provided here are methods and manufacturing systems to implant protons into SiC IGBT devices at multiple depths in the drift layer of the SiC IGBT device. Provides are SiC IGBT devices manufactured with process steps including multiple proton implant processes where the SiC IGBT device is irradiated with ion to affect proton implantation into the SiC IGBT device at multiple depths in the drift region to reduced minority carrier lifetime.

19 Claims, 9 Drawing Sheets

MINORITY CARRIER LIFETIME REDUCTION FOR SIC IGBT DEVICES

FIELD OF THE DISCLOSURE

The present description, example embodiments, and claims relate to semiconductor devices and particularly to reducing minority carrier lifetime in silicon carbide (SiC) semiconductor devices including insulated-gate bipolar transistor (IGBT) devices.

BACKGROUND OF THE DISCLOSURE

An insulated-gate bipolar transistor (IGBT) device generally includes a metal oxide semiconductor field effect transistor (MOSFET) that drives a wide base of a bipolar junction transistor (BJT). IGBT devices have become a key power device for high current and high voltage uses, particularly for motor control and induction heating type applications.

In general, the collector current in an IGBT device is due to the flow of charge carriers from a heavily doped emitter into a base where there are minority carriers that diffuse toward the collector. Given this, IGBT devices are classified as minority-carrier devices. The speed at which the minority carriers recombine is referred to as the minority carrier lifetime. Minority carrier lifetime is an important characteristic as it affects the time and power needed to turn of the IGBT device.

Silicon carbide (SiC) has a wider bandgap, higher critical field strength, twice the saturation velocity, and three times the thermal conductivity compared to silicon (Si). It is therefore expected that SiC power devices will outperform their silicon counterparts, and as a result, SiC IGBT devices are expected to overtake Si IGBT devices in popularity for medium to high voltage (e.g., 8 kV to 20 kV) applications. However, given the semiconductor physics of SiC versus Si, minority carrier lifetime will be an even greater issue for SiC IGBT devices versus Si IGBT devices. In many applications, it will be necessary to reduce the minority carrier lifetime of SiC IGBT devices in order to provide a device with desirable static and dynamic properties and that will turn off in a reasonable time.

BRIEF SUMMARY

Brief Description of the Several Views of the Drawings

To easily identify the discussion of any particular element or act, the most significant digit or digits in a reference number refer to the figure number in which that element is first introduced. Furthermore, like numbering represents like elements.

The drawings are merely representations, not intended to portray specific parameters of the disclosure and are not necessarily to scale. The drawings are intended to depict exemplary embodiments of the disclosure, and therefore are not be considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

Figure 1B:
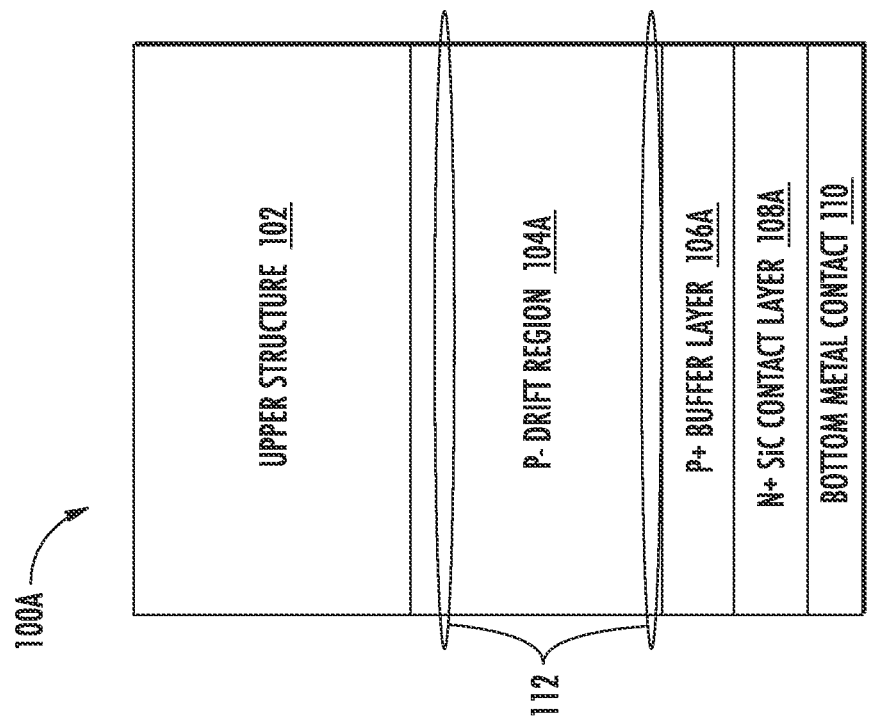
Figure 1A:
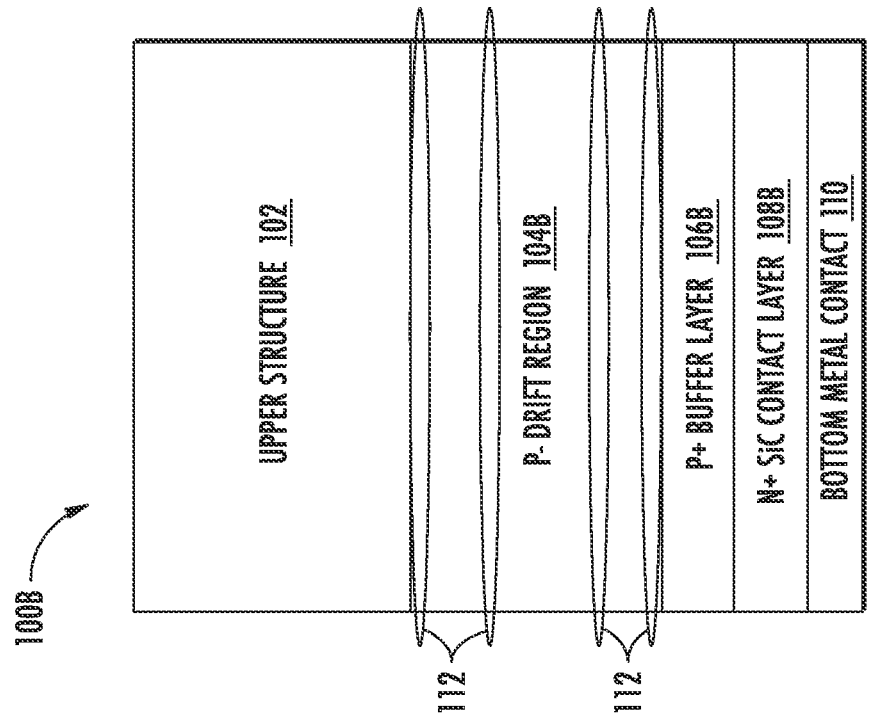

FIG. 1A illustrates a SiC IGBT in accordance with at least one embodiment of the present disclosure.

FIG. 1B illustrates another SiC IGBT in accordance with at least one embodiment of the present disclosure.

Figure 2:
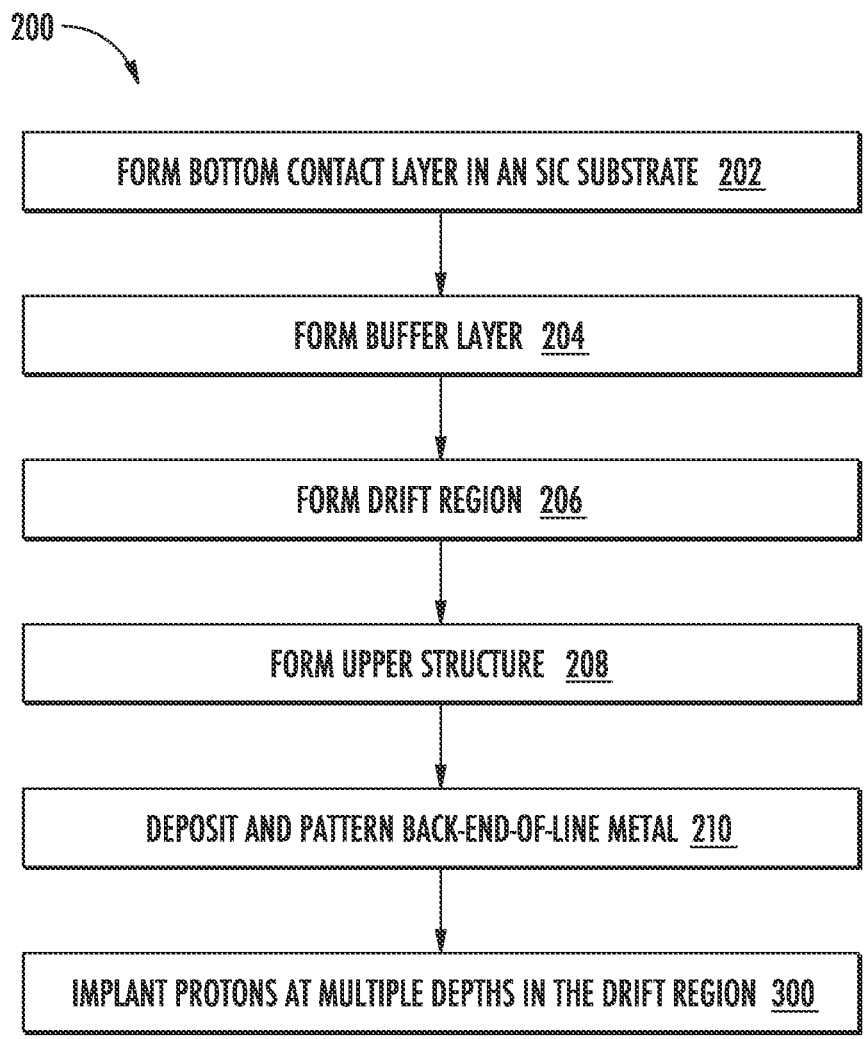

FIG. 2 illustrates a method of manufacturing a SiC IGBT in accordance with at least one embodiment of the present disclosure.

Figure 3:
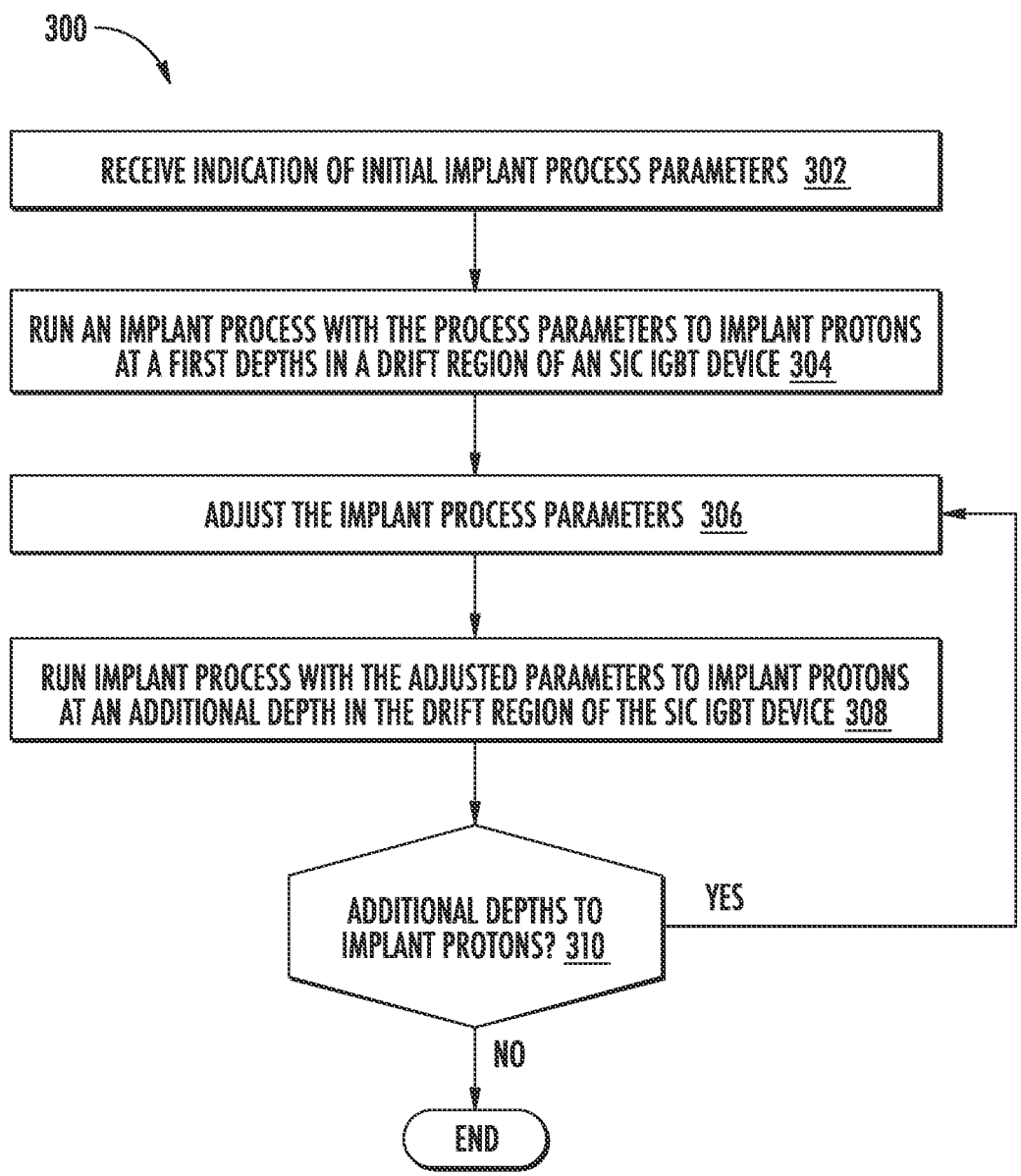

FIG. 3 illustrates a method of implanting protons as part of a method of manufacturing a SiC IGBT in accordance with at least one embodiment of the present disclosure.

Figure 4:
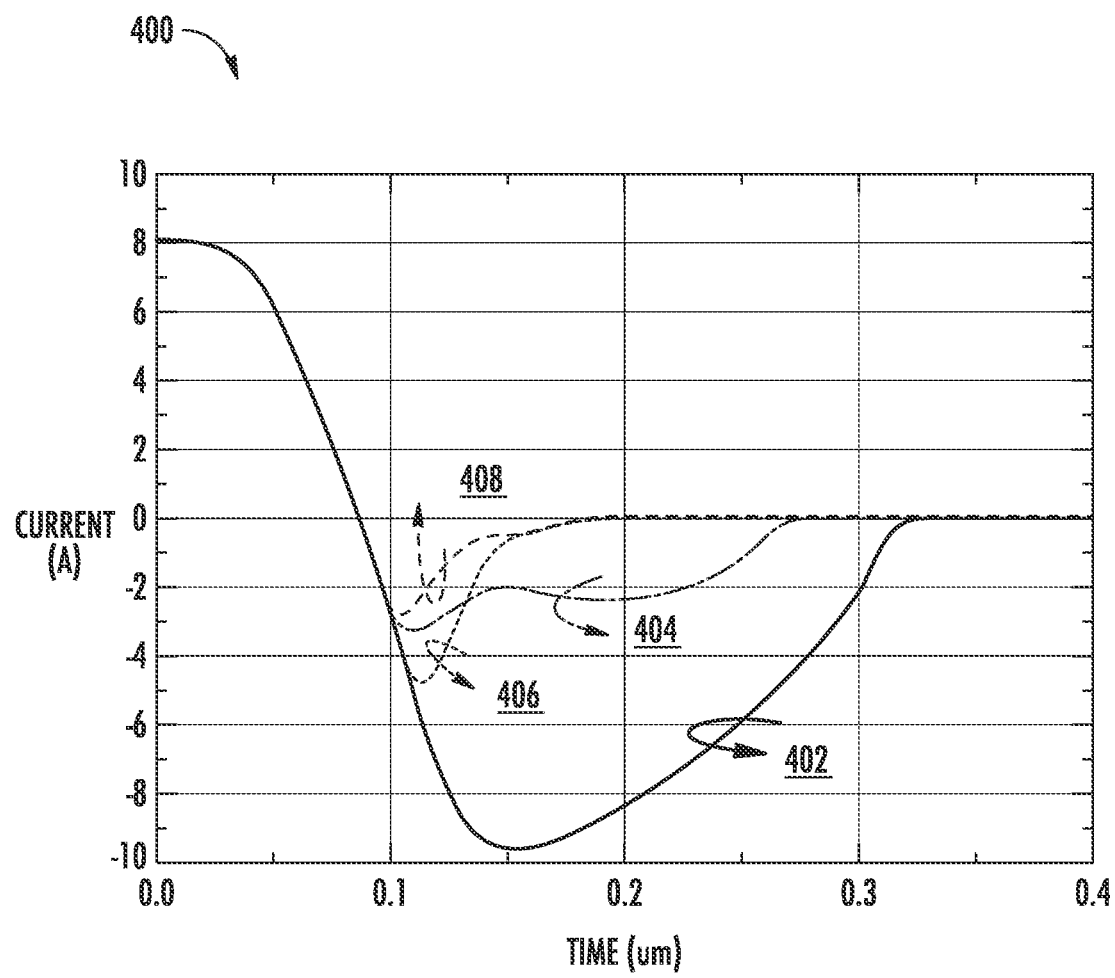

FIG. 4 illustrates plot depicting reverse recovery current for SiC IGBT devices in accordance with embodiments of the present disclosure.

Figure 5B:
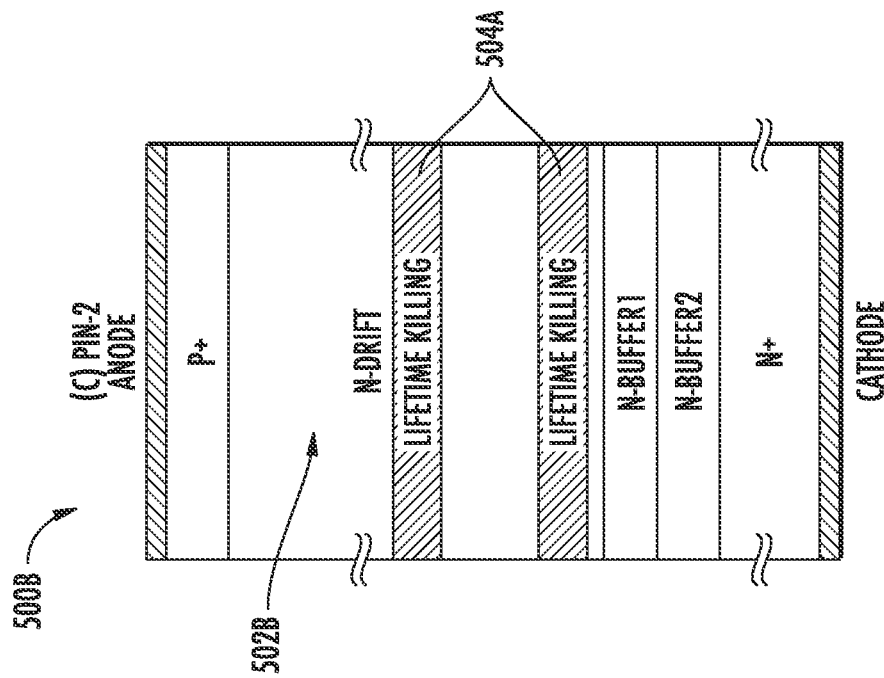
Figure 5A:
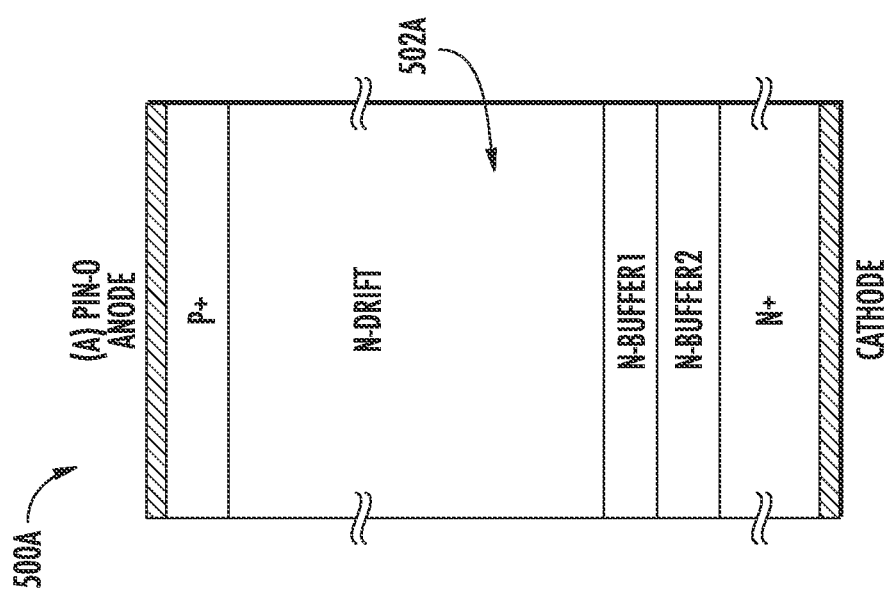

FIG. 5A illustrates a SiC IGBT device.

FIG. 5B illustrates a SiC IGBT device in accordance with at least one embodiment of the present disclosure.

Figure 5D:
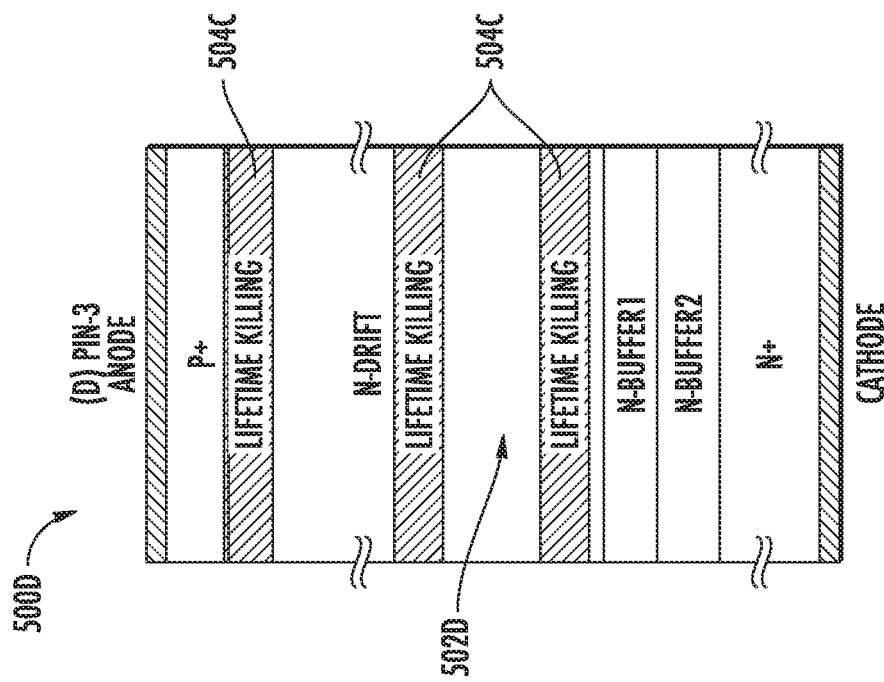
Figure 5C:
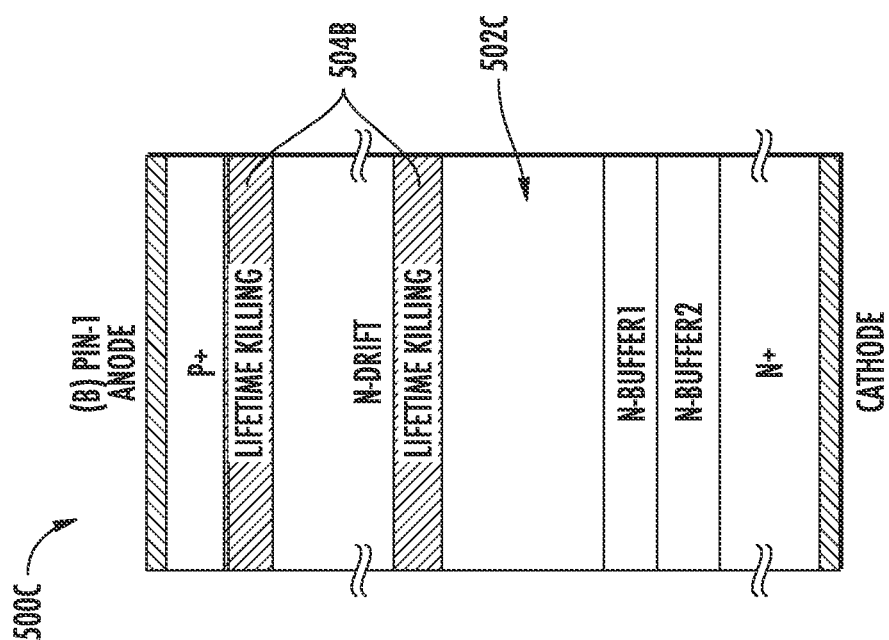

FIG. 5C illustrates another SiC IGBT device in accordance with at least one embodiment of the present disclosure.

FIG. 5D illustrates yet another SiC IGBT device in accordance with at least one embodiment of the present disclosure.

Figure 6:
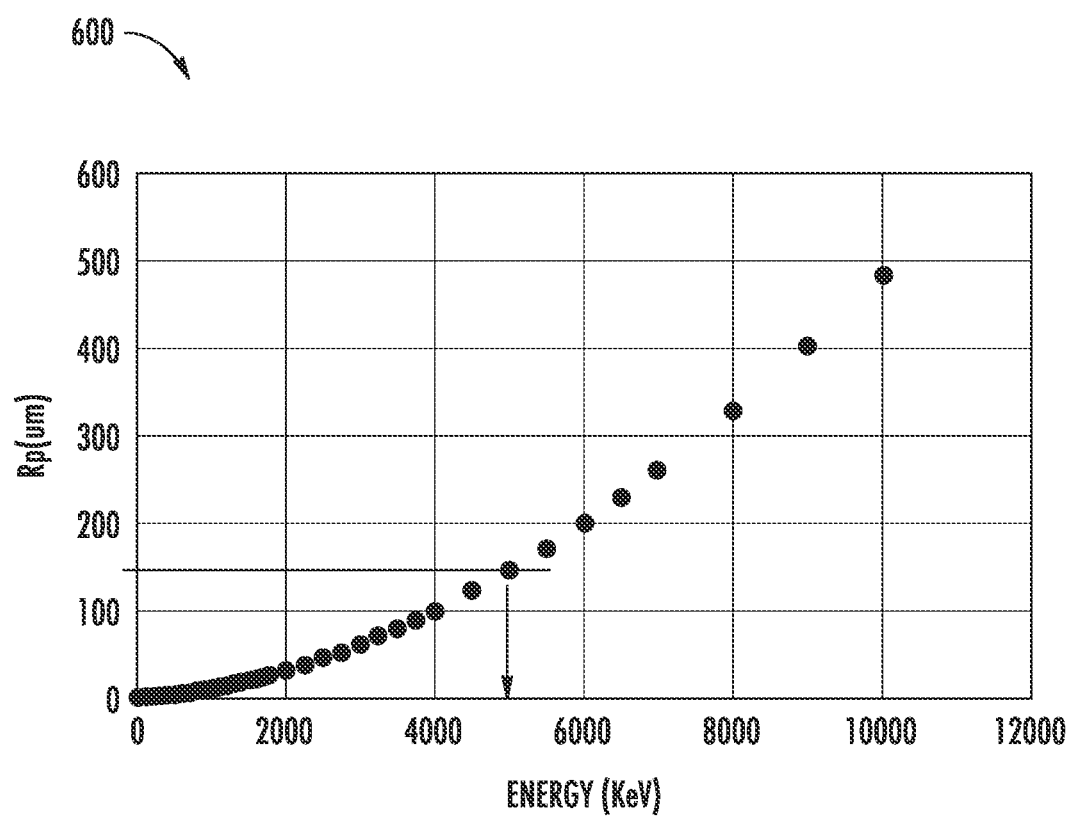

FIG. 6 illustrates a graph depicting simulated levels at which protons will be implanted into a substrate relative to implantation energy in accordance with embodiments of the present disclosure.

Figure 7:
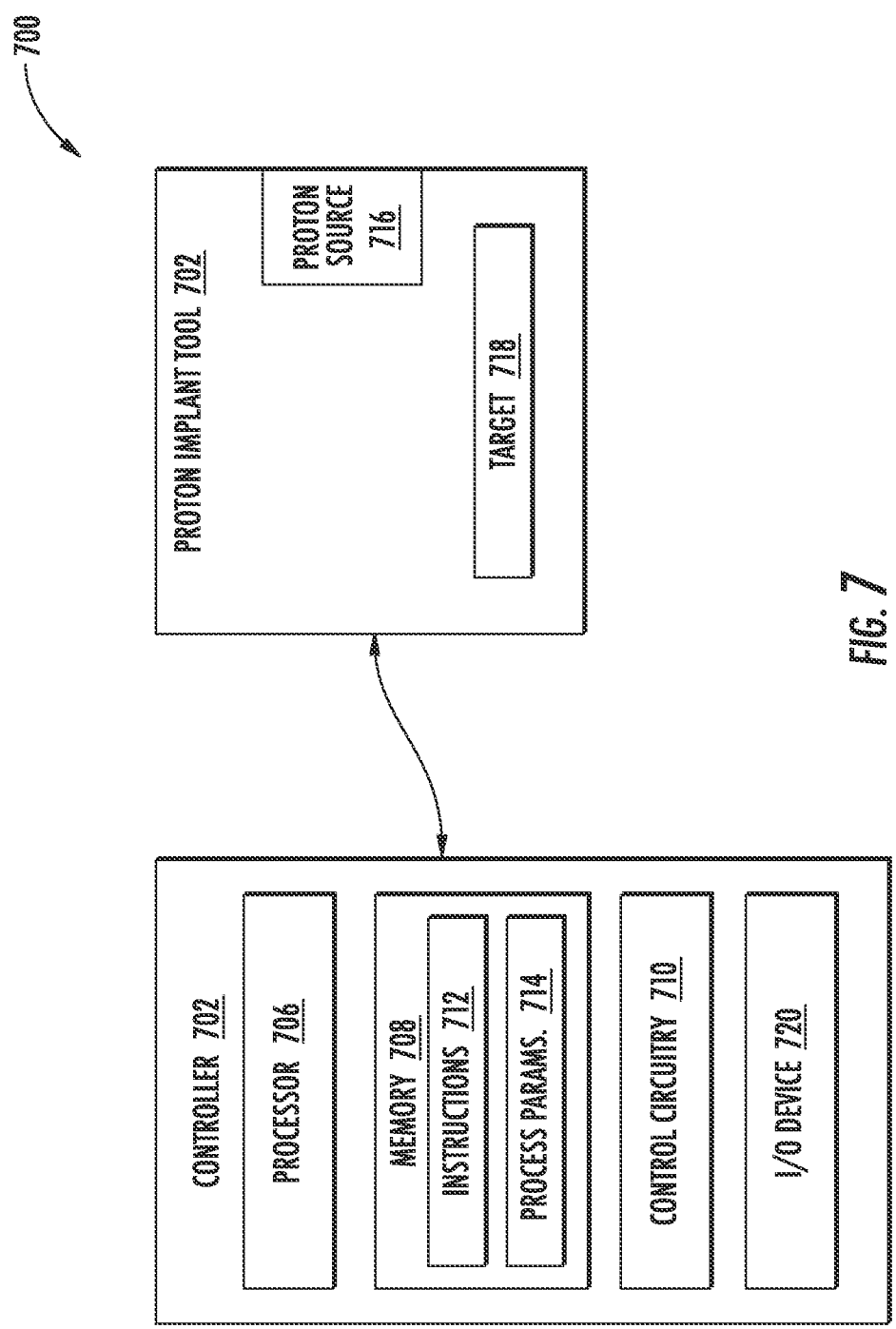

FIG. 7 illustrates a system in accordance with embodiments of the present disclosure.

Figure 8:
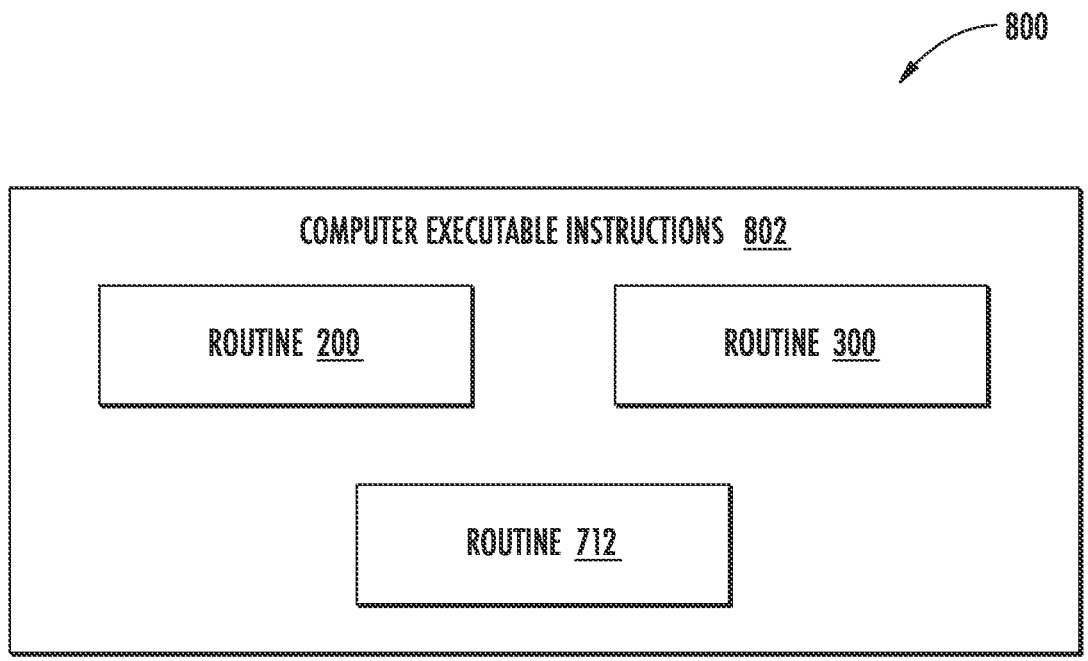

FIG. 8 illustrates a computer-readable storage medium in accordance with embodiments of the present disclosure.

DETAILED DESCRIPTION

Methods, devices, and systems in accordance with the present disclosure will now be described more fully hereinafter with reference to the accompanying drawings, where various embodiments are shown. The methods, devices, and systems may be embodied in many different forms and are not to be construed as being limited to the embodiments set forth herein. Instead, these embodiments are provided so the disclosure will be thorough and complete, and will fully convey the scope of the described methods and devices to those skilled in the art.

As mentioned above, the present disclosure provides methods and manufacturing systems to reduce the minority carrier lifetime of SiC IGBT devices. Accordingly, the SiC IGBT devices produced based on the methods and systems described herein will have a reduced turn-off power requirement as well as a reduced turn-off time versus conventional SiC IGBT devices. In general, embodiments herein reduce minority carrier lifetime of SiC IGBT devices by irradiating the SiC IGBT devices with ions to affect proton implantation into the SiC IGBT device. In particular, the SiC IGBT devices are irradiated at multiple energies to affect proton implantation into the n-drift layer of the SiC IGBT device at multiple depths. These multiple layers of implanted protons reduce the minority carrier lifetime in the drift region.

It is to be appreciated that there are a variety of different IGBT structures. An IGBT device can have different top layer structures (e.g., trench cluster IGBT (TC-IGBT), diode clamped shield IGBT (DCS-IGBT), or the like); different middle layer structures (e.g., super junction, P+ buried layer, depletion-controlled (DC) structure, or the like); and different lower layer structures (e.g., backside npn-collector (npn-IGBT), collector side schottky contact (SC-IGBT), bidirectional IGBT (BD-IGBT), or the like). However, all IGBT structures have a drift layer disposed over a buffer layer and a bottom contact layer. FIG. 1A illustrates a SiC IGBT device 100a. As depicted, SiC IGBT device 100a includes an upper structure 102, which can be any of a variety of SiC MOSFET upper structures, such as, TC-IGBT or DCS-IGBT. SiC IGBT device 100a further includes drift region 104a, which in this embodiment is negatively doped P-type drift region 104a. Below the drift region 104a is a buffer layer 106a, which in this embodiment is a positively doped P-type buffer layer 106a. Beneath the drift region 104a is a contact layer 108a disposed over a bottom metal contact 110. As depicted, the contact layer 108a in this embodiment is a positively doped N-type SiC contact layer 108a.

As noted, the present disclosure is applicable to a variety of IGBT structures. As such, FIG. 1B illustrates another SiC IGBT device 100b. SiC IGBT device 100b is similar to SiC IGBT device 100a in that the device is a SiC IGBT device with an upper structure 102. However, SiC IGBT device 100b includes a negatively doped N-type drift region 104b, a positively doped N-type buffer layer 106b as well as a positively doped N-type contact Layer 108b.

SiC IGBT device 100a and SiC IGBT device 100b include implant regions 112 formed in the drift region 104a and drift region 104b. For example, SiC IGBT device 100a includes three separate implant regions 112 formed at different depths of drift region 104a while SiC IGBT device 100b includes four separate implant regions 112 formed at different depths of drift region 104b. The present disclosure can be applied to form any number of implant regions 112 at any of a variety of depths. However, typically implant regions 112 will be formed at 2 or more depths.

Implant regions 112 reduce the minority carrier lifetime of drift region 104a and drift region 104b as described above and more completely below. Accordingly, SiC IGBT device 100a and 100b can have a faster turn-off time and lower turn-off power requirement than conventional SiC IGBT devices.

FIG. 2 illustrates a routine 200 for manufacturing a SiC IGBT device, in accordance with non-limiting example(s) of the present disclosure. It is noted that routine 200 can be applied to manufacture an IGBT device (e.g., a SiC IGBT device, or the like) or other fast switching devices, such as a super junction MOSFET, other type of device where the drift region has a high number of minority carriers, which can lead to high minority carrier lifetime. Accordingly, although reference to a SiC IGBT device and structure are used herein to described routine 200, embodiments of the present disclosure can be applied to reduce minority carrier lifetime in other devices and claims are not limited in this respect.

Routine 200 is described with reference to the SiC IGBT device 100a of FIG. 1A and FIG. 1B. However, routine 200 could just as easily be applied to form SiC IGBT device 100b of FIG. 1B or another high voltage, fast switching SiC type device. Routine 200 can being at block 202 "form bottom contact layer in a SiC substrate" a bottom contact layer can be formed in a SiC substrate. For example, an N-type cathode can be formed by an epitaxy process (e.g., growing, depositing, or the like) N-type material on a SiC substrate to form contact layer 108a. Additionally, at block 202, the N-type material of contact layer 108a can be doped to have a particular charge, such a positive in the case of the contact layer 108a of SiC IGBT device 100a.

Continuing to block 204 "form buffer layer" a field stop or buffer layer can be formed on the contact layer 108a. For example, a P-type field stop layer can be formed (e.g., via an epitaxy process, or the like) on the N-type material formed at block 202 to form buffer layer 106a. Additionally, at block 204, the P-type material of buffer layer 106a can be doped to have a particular charge, such a positive in the case of the buffer layer 106a of SiC IGBT device 100a Continuing to block 206 "form drift region" the drift region can be formed on the buffer layer 106a. For example, more P-type material can be formed (e.g., via an epitaxy process, or the like) and can be doped to have a different charge than the P-type material of buffer layer 106a (e.g., negative in this embodiment) to form the drift region 104a.

Continuing to block 208 "form upper structure" the upper layer structure can be formed. For example, one of a variety of MOSFET structures (e.g., TC-IGBT, DCS-IGBT, or the like) can be manufactured to form upper structure 102. In some examples, upper structure 102 can be formed via a variety of sub-processes, such as, doping, depositing, patterning, etching, filling, polishing, etc. Further, the present disclosure is not limited to a specific device structure for upper structure 102. Upper structure 102 can include metal contact layers (e.g., collector electrode, gate electrode, emitter electrode, the like).

Continuing to block 210 "deposit and pattern back-end-of-line (BEOL) metal" the BEOL metal can be deposited and/or patterned. For example, bottom metal contact 110 (e.g., collector electrode, gate electrode, emitter electrode, the like).

From block 210, routine 200 can perform routine 300 as a subroutine. Routine 300 is described in greater detail below with respect to FIG. 3. However, in general, routine 300 provides to implant protons at multiple depths in the drift region. It is noted, that specific examples of process steps (e.g., deposition and/or implantation materials, process energies, process times, layer height, etching characteristics, etc.) are not provided as the process of implanting protons in the drift regions (e.g., routine 300) is applicable to a number of different SiC IGBT structures (as well as other fast switching devices). Accordingly, specific details of device formation processes are omitted from this disclosure.

FIG. 3 illustrates routine 300, in accordance with non-limiting example(s) of the present disclosure. In general, routine 300 provides a proton implant process, such as, a hydrogen proton implant process. Routine 300 can be implemented to implant protons in a drift region of a SiC IGBT device at multiple depths to reduce the minority carrier lifetime of the SiC IGBT device. Routine 300 can begin at block 302 "receive indication of initial implant process parameters" the initial parameters of the proton implant process can be received. For example, a proton implant device can receive an indication (e.g., from a configuration file, from a user interface, from an input/output device, or the like) of initial parameters of the proton implant process. In some embodiments, initial proton implant parameters can be 15 MeV doping energy with E15/cm$^2$ dose of hydrogen protons. Further, proton implant can be facilitated by a number of different proton implant tools.

Continuing to block 304 "run implant process to implant protons at a first depth in a drift region of a SiC IGBT device" an implant process can be run, using the parameters received at block 302, to implant protons at a particular depth in a drift region of an IGBT device. Using the example parameters from block 302, protons can be implanted into SiC IGBT device 100a or 100b by an implant tool using 15 MeV doping energy and E15/cm$^2$ dose to form a band where the minority carrier lifetime is reduced in the drift region of the SiC IGBT device (e.g., implant regions 112 in drift region 104a or 104b, or the like).

The present disclosure provides that multiple bands or regions in the drift layer where minority carrier lifetime is reduced are formed. That is, routine 300 provides to implant protons into the drift layer of a SiC IGBT device at multiple depths. Accordingly, multiple implant processes or "runs" are contemplated. Continuing to block 306 "adjust the implant process parameters" the implant parameters can be adjusted. For example, doping energy can be increased or decreased, the dose can be increased or decreased, or both the doping energy can be increased or decreased and the dose can be increased or decreased. As a specific example, block 306 can adjust the implant process parameters to be 7.5 MeV doping energy with E12.5/cm$^2$ dose.

Continuing to block 308 "run implant process with adjusted process parameters to implant protons at an additional depth in the drift region of the SiC IGBT device" the implant process can be run using the adjusted parameters from block 306, to implant protons at an additional depth in the drift region of the IGBT device. Using the example parameters from block 306, protons can be implanted into SiC IGBT device 100a or 100b by an implant tool using 7.5 MeV doping energy and E12.5/cm$^2$ dose to form another band where the minority carrier lifetime is reduced in the drift region of the SiC IGBT device (e.g., another implant regions 112 in drift region 104a or 104b, or the like).

In some embodiments, only two implant regions 112 can be formed in drift region 104a or drift region 104b of SiC IGBT device 100a or SiC IGBT device 100b. For example, drift region 104a of SiC IGBT device 100a depicted in FIG. 1A shows two implant regions 112. In other embodiments, more than two implant regions 112 can be formed in drift region 104a or drift region 104b of SiC IGBT device 100a or SiC IGBT device 100b. For example, drift region 104b of SiC IGBT device 100b depicted in FIG. 1B shows more than two implant regions 112. It is noted that any number, more than one, of implant regions 112 can be formed according to the present disclosure. Furthermore, in some embodiments, implant regions 112 can be formed proximate to the bottom and the top of the drift region, as depicted in drift region 104b of FIG. 1B. However, it is noted that the implant regions may not exactly align with the depth at the top or bottom of the drift regions and the claims are not limited in this respect.

Continuing to decision block 310 "additional depths to implant protons?" a determination is made as to whether protons are to be implanted at additional depths. For example, where more than two implant regions 112 are to be formed then it can be determined at decision block 310 that protons are to be implanted at additional depths if block 306 and block 308 have only been executed once. From decision block 310, routine 300 can end or can return to block 306. In particular, routine 300 can return to block 306 from decision block 310 based on a determination that protons are to be implanted at additional depths while routine 300 can end after decision block 310 based on a determination that protons are not to be implanted at additional depths.

As a specific example, routine 300 can return to block 306 to implant protons at a third depth in the drift region of the SiC device. As such, routine 300 can continue with another iteration of block 306 "adjust the implant process parameters" where the implant parameters can be again adjusted. For example, doping energy can be increased or decreased, the dose can be increased or decreased, or both the doping energy can be increased or decreased and the dose can be increased or decreased. As a specific example, block 306 can adjust the implant process parameters to be 5 MeV doping energy with E11/cm$^2$ dose.

Continuing to block 308 "run implant process with adjusted process parameters to implant protons at an additional depth in the drift region of the SiC IGBT device" the implant process can be run using the adjusted parameters from block 306, to implant protons at an additional depth in the drift region of the IGBT device. Using the example parameters from the second iteration of block 306, protons can be implanted into SiC IGBT device 100a or 100b by an implant tool using 5 MeV doping energy and E11/cm$^2$ dose to form another band where the minority carrier lifetime is reduced in the drift region of the SiC IGBT device (e.g., another implant regions 112 in drift region 104a or 104b, or the like).

With some embodiments, implantation of protons can start with higher energies and doses and then adjust the energy and dose down as additional implant processes are executed. In other embodiments, the implantation of protons can start at lower energies and doses and then adjust the energy and dose up as additional implant processes are executed. The present disclosure can be applied to implant protons are multiple depths of a variety of high voltage SiC IGBT devices. For example, SiC IGBT devices formed according to the present disclosure may be arranged to operate with voltages from 1200 volts (V) to 20K V. Furthermore, SiC IGBT devices formed according to the present disclosure may have a variety of epitaxy heights, such as, for example, from 10 micrometer (μm) epitaxy (e.g., a 1200V SiC IGBT device) to 180 μm epitaxy (e.g., a 20 kV SiC IGBT device). Further, although the example doping energies above have a range of 5 MeV to 15 MeV, in some embodiments, doping energies can be between 0.1 MeV and 15 MeV.

FIG. 4 illustrates a plot 400 showing curves depicting the reverse recovery current for SiC IGBT devices having protons implanted into their drift region, in accordance with non-limiting example(s) of the present disclosure. In particular, this figure depicts current in Amps (A) on the Y-axis and time in microseconds (μs) on the X-axis to show the recovery current.

Curve 402 depicts recovery current for a SiC IGBT device without protons implanted in the drift region, such as a conventional SiC IGBT device whereas curves 404, 406, and 408 depict recovery current for a SiC IGBT device with protons implanted in the drift region (e.g., SiC IGBT device 100a, SiC IGBT device 100b, or the like). As can be seen, the recovery current for curves 404, 406, and 408 recovers or returns to 0 substantially faster than does the recovery current for curve 402. As such, the SiC IGBT devices manufactured according to the present disclosure provide for reduced turn-off time and current versus conventional devices. In particular, the turn off time for SiC IGBT devices with protons implanted at multiple depths in their drift regions as described herein is 20% to more than 100% faster than conventional devices. Additionally, the reverse current needed to turn-off these SiC IGBT devices is 20% to 40% of the reverse current required to turn-off conventional devices.

FIG. 5A illustrates a SiC IGBT device 500a without protons implanted in it's drift region 502a. SiC IGBT device 500a is has a reverse current represented by curve 402 of plot 400 of FIG. 4.

FIG. 5B illustrates a SiC IGBT device 500b with two implant regions 504a in it's drift region 502b. As depicted, one of implant regions 504a is at the bottom of drift region 502b while the other one of implant regions 504a is substantially in the center of drift region 502b. SiC IGBT device 500b has a reverse current represented by curve 404 of plot 400 of FIG. 4.

FIG. 5C illustrates a SiC IGBT device 500c with two implant regions 504b in it's drift region 502c. As depicted, one of implant regions 504b is at the top of drift region 502c while the other one of implant regions 504b is substantially in the center of drift region 502c. SiC IGBT device 500c has a reverse current represented by curve 406 of plot 400 of FIG. 4.

FIG. 5D illustrates a SiC IGBT device 500d with three implant regions 504c in it's drift region 502d. As depicted, one of implant regions 504c is substantially in the center of drift region 502d while the other two ones of implant regions 504c are at the top of drift region 502d and bottom of drift region 502d. SiC IGBT device 500d has a reverse current represented by curve 408 of plot 400 of FIG. 4.

FIG. 6 illustrates a graph 600 depicting simulated levels at which protons will be implanted into a substrate relative to implantation energy. In particular, graph 600 depicts implantation projected range (Rp) in micrometers (μm) on the Y-axis and implantation energy in kiloelectron volts (KeV) on the X-axis.

FIG. 7 illustrates a proton implant system 700 comprising a controller 702 and proton implant tool 704. Controller 702 is communicatively (e.g., electrically or wirelessly) coupled to proton implant tool 704 and arranged to receive signals from proton implant tool 704 and to communicate control signals to proton implant tool 704.

In general, proton implant tool 704 operates to accelerate protons into a target (e.g., SiC IGBT device, or the like) to implant the protons into the target and affect a change (e.g., change in semiconductor physics, or the like) in the target. Proton implant tool 704 may include a proton source 716 arranged to provide protons (e.g., hydrogen protons, or the like) that can be accelerated by proton implant tool 704 into a target 718. Proton implant tool 704 may further include various components (not shown) to support implantation of protons into target 718, such as, beam-line components, lenses, a platen to support the target 718 during processing, heating components, sensor components, or the like.

In operation, protons of the desired type (e.g., hydrogen) are generated and extracted from the proton source 716. Thereafter, the protons are accelerated (can be in a beam-like state, etc.) to be implanted into target 718.

In some embodiments, proton implant tool 704 can be controlled by a computing device, such as, controller 702. Controller 702 can be any of a variety of computing devices, such as, a workstation, a laptop, a server, or the like. In some embodiments, controller 702 and proton implant tool 704 are integrated into the same enclosure or housing. In other embodiments, controller 702 and proton implant tool 704 are separate devices. In general, controller 702 is arranged to control the energy and dose for the proton implant process. The controller 702 may include processing circuitry, such as processor 706 and memory circuitry, such as, memory 708. The controller 702 can further include control circuitry 710 and input/output devices 720. Processor 706 can be electrically coupled to memory 708 and arranged to execute computer-executable instructions, such as, instructions 712 to facilitate processing target 718 and particularly implanting protons into target 718.

Controller 702 can also include control circuitry 710, such as hardware for monitoring proton implant processing via sensors (not shown) in proton implant tool 704. To facilitate control of the proton implant tool 704 described above, processor 706 may be one of any form of general-purpose computer processor that can be used in an industrial setting, such as a programmable logic controller (PLC), for controlling various chambers and sub-processors, a field-programmable gate-array (FPGA), an application integrated circuit (ASIC), a commercial central processing unit (CPU) having one or more processing cores. Memory 708 can be non-transitory memory and may be one or more of readily available memory such as random-access memory (RAM), read only memory (ROM), floppy disk drive, hard disk, solid-state drive, flash memory, or the like. Memory 708 can store instructions 712, which are executable by memory 708 as well as proton implant process parameters 714, which can include information such as the energy and dose for each iteration of a multi-iteration proton implant process as described herein.

The instructions 712 stored in memory 708 are in the form of a program product or a computer-readable storage medium, that can cause circuitry (e.g., processor 706) to implement the methods of the present disclosure when executed. FIG. 8 illustrates computer-readable storage medium 800. Computer-readable storage medium 800 may comprise any non-transitory computer-readable medium, storage device(s), or machine-readable storage medium, such as an optical, magnetic or semiconductor storage medium. In various embodiments, computer-readable storage medium 800 may comprise an article of manufacture. In some embodiments, computer-readable storage medium 800 may store computer executable instructions 802 with which circuitry (e.g., memory 708, control circuitry 710, or the like) can execute. For example, computer executable instructions 802 can include instructions to implement operations described with respect to routine 200, routine 300, and/or instructions 712. Examples of computer-readable storage medium 800 or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions 802 may include any suitable type of code, such as source code, compiled code, interpreted code, executable code, static code, dynamic code, object-oriented code, visual code, and the like.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the SiC IGBT device 100a, SiC IGBT device 100b, etc. (e.g., as described herein). Data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software or implemented in hardware.

As used herein, a module might be implemented utilizing any form of hardware, software, or a combination thereof. For example, one or more processors, controllers, application specific integrated circuits (ASICs), programmable logic arrays (PLAs), logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high-density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    forming a silicon carbide (SiC) semiconductor device comprising at least a drift layer, an upper structure about the drift layer, and a bottom metal contact below the drift layer;
    performing a first proton implant process to implant protons into the drift layer at a first depth; and
    performing a second proton implant process to implant protons into the drift layer at a second depth, the second depth different from the first depth, wherein the upper structure and the bottom metal contact are formed before the first proton implant process and the second proton implant process.

2. The method of claim 1, wherein the first proton implant process and the second proton implant process are hydrogen proton implant processes.

3. The method of claim 1, wherein an energy of the first proton implant process and the energy of the second proton implant process are between 0.1 MeV and 15 MeV and wherein the energy of the second proton implant process is different from the energy of the first proton implant process.

4. The method of claim 1, wherein a dose of the first proton implant process and the dose of the second proton implant process are between $E11/cm^2$ and $E15/cm^2$ and wherein the dose of the second proton implant process is different from the dose of the first proton implant process.

5. The method of claim 1, comprising performing a third proton implant process to implant protons into the drift layer at a third depth, the third depth different from the first depth and the second depth.

6. The method of claim 5, wherein the first depth is substantially near a bottom of the drift layer, the second depth is substantially near a middle of the drift layer, and the third depth is substantially near a top of the drift layer.

7. The method of claim 1, where the SiC semiconductor device is an insulated-gate bipolar junction transistor (IGBT).

8. A semiconductor device process method, comprising:
    implanting protons into a drift layer of a silicon carbide (SiC) semiconductor device based on a first proton implant process, the first proton implant process to implant protons at a first depth in the drift layer, wherein the SiC semiconductor device includes an upper structure over the drift layer and a bottom metal contact below the drift layer; and
    implanting protons into the drift layer of the SiC semiconductor device based on a second proton implant process, the second proton implant process to implant protons at a second depth in the drift layer different than the first depth, wherein the upper structure and the bottom metal contact are formed before the first proton implant process and the second proton implant process.

9. The semiconductor device process method of claim 8, wherein the first proton implant process and the second proton implant process are hydrogen proton implant processes.

10. The semiconductor device process method of claim 8, wherein an energy of the first proton implant process and the energy of the second proton implant process are between 0.1 MeV and 15 MeV and wherein the energy of the second proton implant process is different from the energy of the first proton implant process.

11. The semiconductor device process method of claim 8, wherein a dose of the first proton implant process and the dose of the second proton implant process are between E11/cm² and E15/cm² and wherein the dose of the second proton implant process is different from the dose of the first proton implant process.

12. The semiconductor device process method of claim 8, wherein the SiC semiconductor device is an insulated-gate bipolar junction transistor (IGBT).

13. The semiconductor device process method of claim 12, wherein the SiC semiconductor device comprises a backside npn-collector (npn-IGBT), a collector side schottky contact (SC-IGBT), or a bidirectional IGBT (BD-IGBT) lower structure.

14. The semiconductor device process method of claim 13, wherein the SiC semiconductor device comprises a trench cluster IGBT (TC-IGBT) or a diode clamped shield IGBT (DCS-IGBT) upper structure.

15. The proton implant method of claim 14, wherein the SiC semiconductor device comprises a super junction, a P+ buried layer, or a depletion-controlled (DC) middle layer structure.

16. A non-transitory computer readable medium comprising instructions that when executed by processing circuitry cause the processing circuitry to:
send first control signals to a proton implant tool to cause the proton implant tool to process, with a first proton implant process, a silicon carbide (SiC) semiconductor device to implant protons into a drift layer of the SiC semiconductor device at a first depth, wherein the SiC semiconductor device further includes an upper structure over the drift layer and a bottom metal contact below the drift layer; and
send second control signals to the proton implant tool to cause the proton implant tool to process, with a second proton implant process, the SiC semiconductor device to implant protons into the drift layer of the SiC semiconductor device at a second depth different than the first depth, wherein the upper structure and the bottom metal contact are formed before the first proton implant process and the seocnd proton implant process.

17. The non-transitory computer readable medium of claim 16, further comprising instructions that when executed by the processing circuitry cause the processing circuitry to send third control signals to the proton implant tool to cause the proton implant tool to process, with a third proton implant process, the SiC semiconductor device to implant protons into the drift layer of the SiC semiconductor device at a third depth different than the first depth and the second depth.

18. The non-transitory computer readable medium of claim 16, wherein a dose of the first proton implant process and the dose of the second proton implant process are between E11/cm² and E15/cm² and wherein the dose of the second proton implant process is different from the dose of the first proton implant process.

19. The non-transitory computer readable medium of claim 16, wherein the SiC semiconductor device is an insulated-gate bipolar junction transistor (IGBT).

* * * * *